United States Patent [19]
Maejima

[11] Patent Number: 5,940,019
[45] Date of Patent: Aug. 17, 1999

[54] DELTA-SIGMA A/D CONVERTER

[75] Inventor: Toshio Maejima, Hamamatsu, Japan

[73] Assignee: Yamaha Corporation, Hamamatsu, Japan

[21] Appl. No.: 09/001,381

[22] Filed: Dec. 31, 1997

[30] Foreign Application Priority Data

Jan. 6, 1997 [JP] Japan ................................ 9-000380

[51] Int. Cl.$^6$ ................................................ H03M 3/00
[52] U.S. Cl. ...................................... 341/143; 341/144
[58] Field of Search ................................ 341/143, 144, 341/155, 118, 136

[56] References Cited

U.S. PATENT DOCUMENTS

| | | | |
|---|---|---|---|
| 4,851,841 | 7/1989 | Sooch | 341/143 |
| 5,818,374 | 10/1998 | Tan | 341/143 |
| 5,870,048 | 2/1999 | Kuo et al. | 341/143 |

*Primary Examiner*—Brian Young
*Attorney, Agent, or Firm*—Graham & James LLP

[57] ABSTRACT

A delta-sigma A/D converter has a delta-sigma modulator that converts an analog signal input thereto into a 1-bit digital bit stream by a delta-sigma modulation wherein the difference between the analog signal and a feedback reference voltage is integrated and quantized, the feedback reference voltage being set to a value greater than a specified maximum level of the analog signal. A data converter is connected to an output of the delta-sigma modulator and converts the 1-bit digital bit stream from the delta-sigma modulator into a multi-bit digital bit stream, using a predetermined conversion value. A decimation filter is connected to an output of the data converter and extracts low frequency components corresponding to the analog signal, contained in the multi-bit digital bit stream from the data converter and outputs multi-bit digital data representative of the analog signal.

11 Claims, 6 Drawing Sheets

DELTA-SIGMA A/D CONVERTER

BACKGROUND OF THE INVENTION

1. Field of the Invention

The present invention relates to a delta-sigma A/D converter using a delta-sigma modulator, and more particularly to a delta-sigma A/D converter using a second or higher order delta-sigma modulator, which is capable of generating a full-scale digital output while preventing occurrence of noise produced when the input signal level is equal or close to a full-scale level.

2. Prior Art

Conventionally, there is known a delta-sigma A/D converter which oversamples an analog input signal, subjects the oversampled analog input signal to a delta-sigma modulation (ΔΣ modulation) into a digital bit stream of 1 bit, and filters the bit stream into multi-bit digital data. The prior art A/D converter typically has a basic construction e.g. as shown in FIG. 1, wherein the A/D converter is comprised of a delta-sigma modulator (hereinafter referred to as "ΔΣ modulator") 1 and a decimation filter 2. The ΔΣ modulator 1 may be comprised of an integrator 11 which integrates the difference between an oversampled input signal Si and positive and negative feedback reference voltages ±VREF, and a 1-bit quantizer 12 which subjects the integrated value from the integrator 11 to 1-bit quantization to produce a 1-bit digital bit stream BS, and a feedback reference voltage selector 13 which selects the feedback reference voltage +VREF or −VREF in response to an output from the 1-bit quantizer 12 and feeds back it to the integrator 11. The decimation filter 2 extracts low-frequency components corresponding to the analog input signal Si, contained in the bit stream BS from the ΔΣ modulator 1 and converts the low-frequency components into multi-bit data to thereby output multi-bit digital data Do corresponding to the analog input signal Si.

Generally, in the case of a ΔΣ modulator which is a first-order type, the feedback reference voltage ±VREF is set to a value that is equal to the specified maximal level of the analog input signal such that full-scale digital data (0111 . . . 1 or 1000 . . . 1) are obtained when the analog input signal level is equal to the specified maximal level. In the case of a ΔΣ modulator which is a second or higher order type, however, the signal-to-noise ratio S/N sharply decreases when the analog input signal level assumes a value equal or close to the feedback reference voltage ±VREF, as shown in FIG. 2, as is known in the art.

To overcome this disadvantage, there has been proposed by U.S. Pat. No. 4,851,841 an A/D converter which is capable of obtaining full-scale digital data when the analog input signal level assumes a value at which the maximum analog-to-noise ratio S/N is obtained as shown in FIG. 2, by limiting the maximum analog input signal level of the ΔΣ modulator 1 to 80% of the feedback reference voltage ±VREF, for example, and setting the gain of the decimation filter 2 at a later stage of the ΔΣ modulator to 1.25 times that which is suitable for the decimation filter 2 of FIG. 1.

This proposed delta-sigma A/D converter wherein the maximum analog input signal level is limited to 1/G (=0.8) must have a filter characteristic such that the later-stage decimation filter has a gain of G (=1.25). To this end, all the filter coefficients of the decimation filter have to be set to G. The setting of the filter coefficients, is, however, very troublesome and costly, and therefore it is very difficult to change the gain of the decimation filter once it has been set.

Thus, in the prior art delta-sigma A/D converter, the gain of the ΔΣ modulator is directly determined by the gain of the decimation filter which is difficult to change, making it impossible to easily change the analog input signal level at which full-scale data is obtained.

Further, the former-stage ΔΣ modulator has to be designed so as to match the later-stage decimation filter, which reduces the degree of design freedom.

SUMMARY OF THE INVENTION

It is therefore an object of the invention to provide a delta-sigma A/D converter which facilitates setting or changing the analog input signal level at which full-scale digital data is obtained, thereby increasing the degree of design freedom.

To attain the above object, the present invention provides a delta-sigma A/D converter comprising a delta-sigma modulator for converting an analog signal input thereto into a 1-bit digital bit stream by a delta-sigma modulation wherein a difference between the analog signal and a feedback reference voltage is integrated and quantized, the feedback reference voltage being set to a value greater than a specified maximum level of the analog signal, a data converter connected to an output of the delta-sigma modulator, for converting the 1-bit digital bit stream from the delta-sigma modulator into a multi-bit digital bit stream, using a predetermined conversion value, and a decimation filter connected to an output of the data converter, for extracting low frequency components corresponding to the analog signal, contained in the multi-bit digital bit stream from the data converter and for outputting multi-bit digital data representative of the analog signal.

Preferably, the predetermined conversion value can be set as desired.

More preferably, the predetermined conversion value is set to such a value that the multi-bit digital data from the decimation filter has a full-scale value when the analog signal has a desired level.

Further preferably, the predetermined conversion value is set to such a value that the multi-bit digital data from the decimation filter has a full-scale value when the analog signal has the specified maximum level.

Specifically, the predetermined conversion value is set to a value equal to VREF/VM, where VREF represents the feedback reference voltage, and VM the specified maximum level of the analog signal.

Alternatively, the predetermined conversion value may be a fixed value.

More preferably, the predetermined conversion value is set to such a fixed value that the multi-bit digital data from the decimation filter has a full-scale value when the analog signal has a desired level.

In a preferred embodiment of the invention, the data converter comprises an inverter for inverting the 1-bit digital bit stream from the delta-sigma modulator, a plurality of gate circuits connected to an output of the inverter, and a logic circuit which, when the predetermined conversion value assumes a value falling within a first predetermined range, applies a fixed value to the gate circuits irrespective of the predetermined conversion value and when the predetermined conversion value assumes a value falling within a second predetermined range, applies a predetermined value corresponding to the value falling within the second predetermined range to the gate circuits.

In another preferred embodiment of the invention, the data converter comprises an inverter for inverting the 1-bit digital bit stream from the delta-sigma modulator, a plurality of gate circuits connected to an output of the inverter, and a register for storing coefficients for generating the predetermined conversion value.

Further, to attain the above object, the present invention provides a method of gain scaling a delta-sigma A/D converter having a delta-sigma modulator for converting an analog signal input thereto into a 1-bit digital bit stream by a delta-sigma modulation wherein a difference between the analog signal and a feedback reference voltage is integrated and quantized, the method comprising the steps of setting the feedback reference voltage to a value a predetermined factor greater than a specified maximum level of the analog signal, converting the 1-bit digital bit stream from the delta-sigma modulator into a multi-bit digital bit stream, using a predetermined conversion value corresponding to the predetermined factor, and extracting low frequency components corresponding to the analog signal, contained in the multi-bit digital bit stream and outputting multi-bit digital data representative of the analog signal.

The above and other objects, features, and advantages of this invention will become more apparent from the following detailed description taken in conjunction with the accompanying drawings.

DETAILED DESCRIPTION

The invention will now be described in detail with reference to the drawings showing embodiments thereof.

Figure 1:
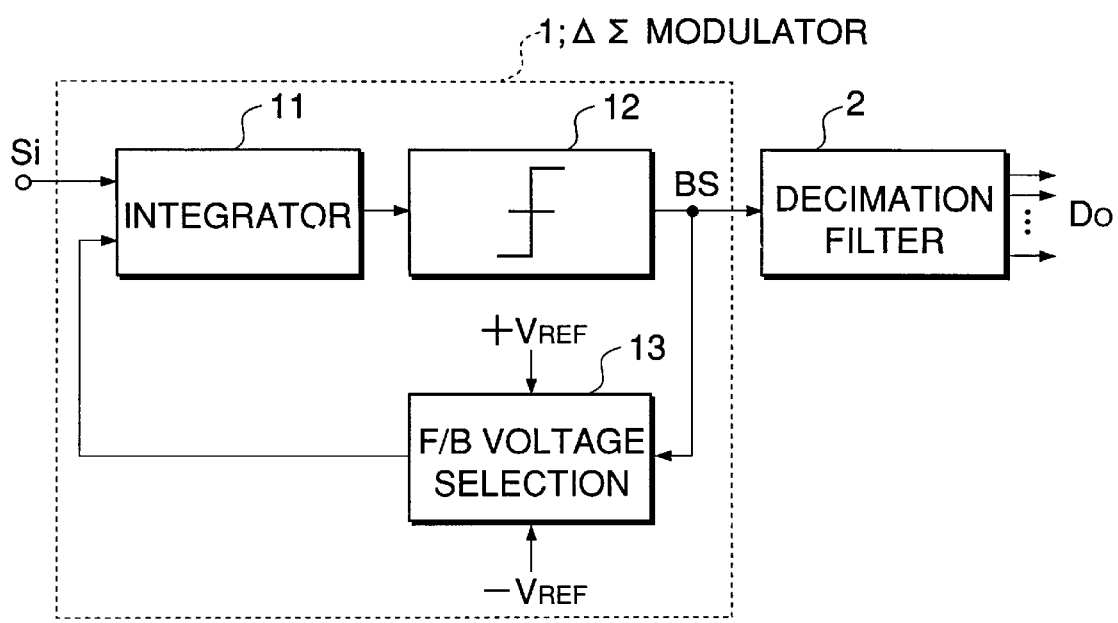
FIG. 1 is a block diagram showing the configuration of a conventional delta-sigma A/D converter.

Referring first to FIG. 1, there is shown the configuration of a delta-sigma A/D converter according to an embodiment of the invention.

The A/D converter according to the present embodiment is comprised of a $\Delta\Sigma$ modulator 21, a data converter 22, and a decimation filter 23. and is characterized in that a digital bit stream BS obtained by the $\Delta\Sigma$ modulator 21 is subjected to data conversion (weighting) using a desired data conversion value by the data converter 22 into a multi-bit digital bit stream, to thereby set the gain as desired.

Figure 2:
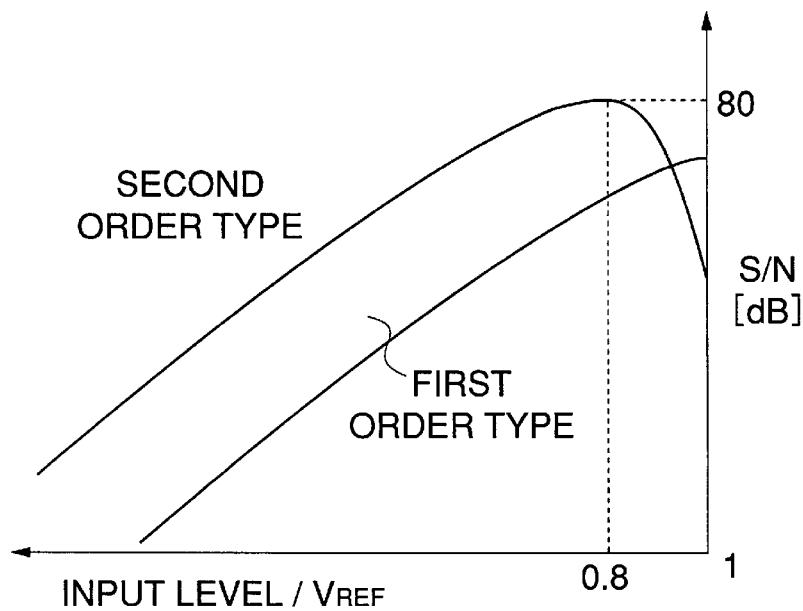
FIG. 2 is a graph showing a S/N vs input level curve of a $\Delta\Sigma$ modulator appearing in FIG. 1.
Figure 3:
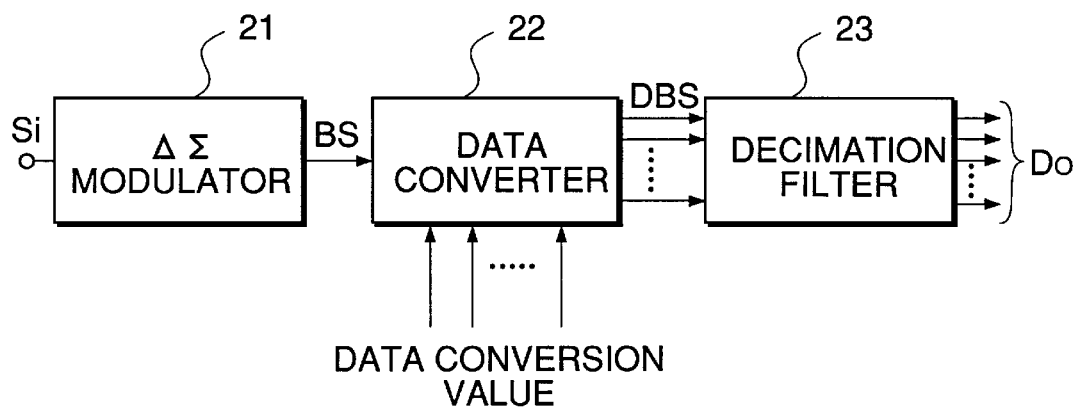
FIG. 3 is a block diagram showing the configuration of a delta-sigma A/D converter according to an embodiment of the present invention.
Figure 4:
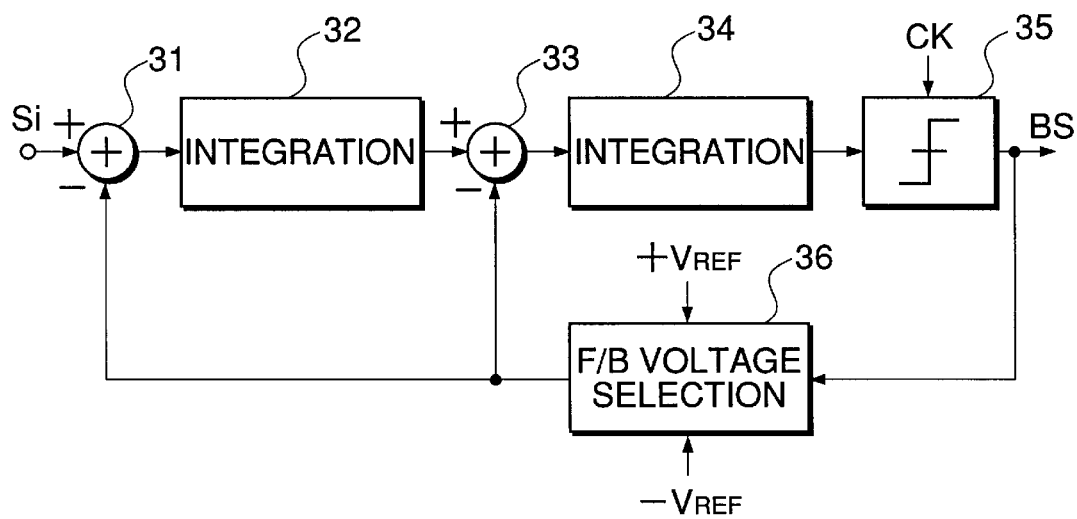
FIG. 4 is a block diagram showing the configuration of a $\Delta\Sigma$ modulator appearing in FIG. 3.

The $\Delta\Sigma$ modulator 21 may be a well-known second order type e.g. as shown in FIG. 4, and constructed such that the difference between the voltage of an analog input signal Si obtained by oversampling and positive feedback reference voltage +VREF or negative feedback reference voltage −VREF is obtained by a subtracter 31, the difference is integrated by a first integrator 32, the difference between an output from the first integrator 32 and the positive feedback reference voltage +VREF or negative feedback reference voltage −VREF is obtained by a subtracter 33, and the difference from the subtracter 33 is integrated by a second integrator 34. An output from the second integrator 34 is subjected to 1-bit quantization by a 1-bit quantizer 35 into a 1-bit digital bit stream BS. The positive feedback reference voltage +VREF or the negative feedback reference voltage −VREF is selected by a feedback reference voltage selector 36 in response to whether the bit stream BS has a value of 1 or 0 and fed back to the subtracters 31, 33. The feedback reference voltages ±VREF are set to a value 1.25 times the specified maximum level of the analog input signal Si, for example, according to the S/N curve in FIG. 2. The maximum allowable level of the analog input signal Si is 0.8 times the reference voltage VREF.

Figure 5:
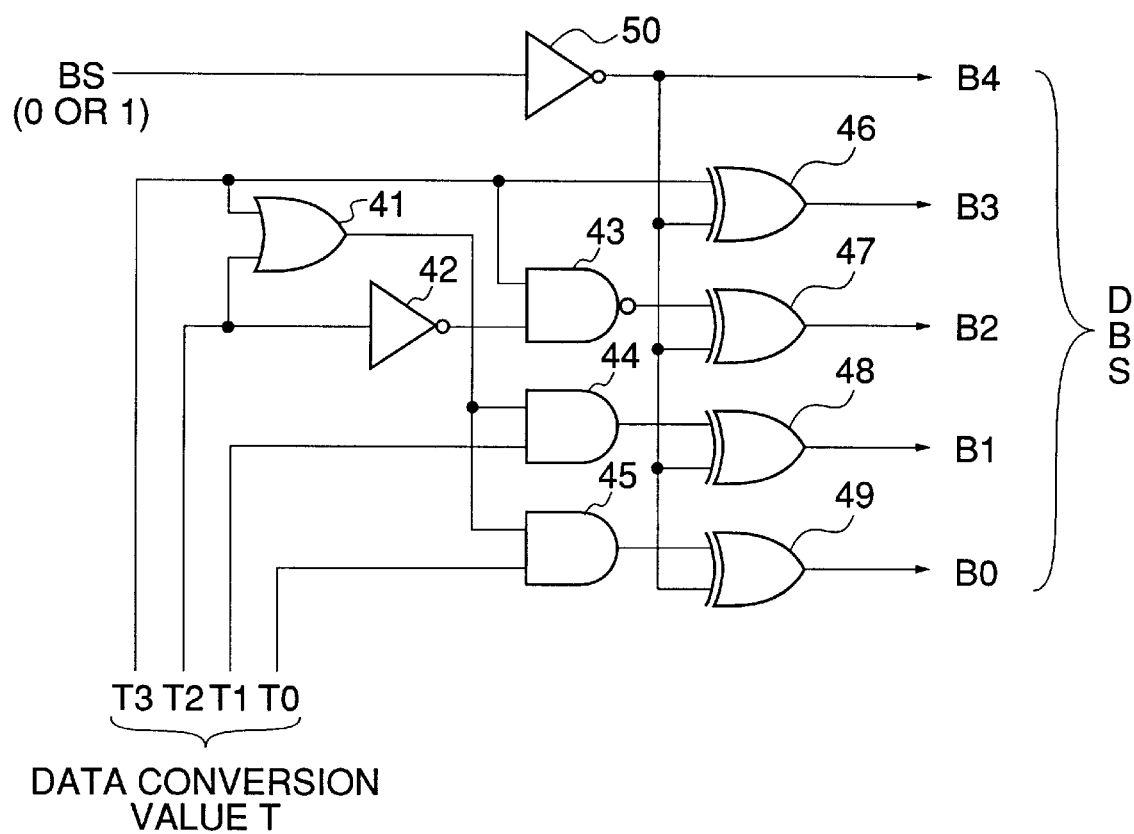
FIG. 5 is a circuit diagram showing the configuration of a data converter appearing in FIG. 3.

The data converter 32 is for converting the 1-bit digital bit stream BS outputted from the $\Delta\Sigma$ modulator 21 into a multi-bit digital bit stream DBS and may be implemented by a plurality of gate circuits e.g. as shown in FIG. 5. In the circuit of FIG. 5, there are provided as a data conversion value T values T3, T2, T1 and T0 which are set to respective different 4-bit values, e.g. 0000–1111. A logic circuit is formed of an OR gate 41, an inverter 42, a NAND gate 43 and AND gates 44 and 45 and selectively applies the data conversion values T3 to T0 to EX-OR gates 46–49 in such a manner that when the data conversion value T to be selected has a value falling within the range from 0000 to 0100, a value of 0100 is input to the EX-OR gates 46–49, and when the data conversion value T has a value falling within the range from 0101 to 1111, the value T is input to the EX-OR gates 46–49. Depending upon whether the bit stream BS which is input to an inverter 50 has a value of 1 or 0, a positive value or a negative value is outputted from the EX-OR gates 46–49. Therefore, if the lower 2 bits (B1, B0) of the 5-bit data-converted output (bit stream DBS) are decimal fractions wherein the bit B1 is given a weight of 0.5, and the bit B0 0.25, the data converter 22 outputs a multi-bit digital bit stream DBS having the following values according to the data conversion value T:

TABLE

| DATA CONVERSION VALUE | | | | DATA-CONVERTED OUTPUT (DBS) | | | | | | | | | | |
|---|---|---|---|---|---|---|---|---|---|---|---|---|---|---|
| | | | | BIT STREAM BS = 1 | | | | | | BIT STREAM BS = 0 | | | | |
| T3 | T2 | T1 | T0 | B4 | B3 | B2 | B1 | B0 | | B4 | B3 | B2 | B1 | B0 |
| 0 | 0 | 0 | 0 | 0 | 0 | 1 | 0 | 0 | (+1.00) | 1 | 1 | 0 | 1 | 1 | (−1.00) |
| 0 | 0 | 0 | 1 | 0 | 0 | 1 | 0 | 0 | (+1.00) | 1 | 1 | 0 | 1 | 1 | (−1.00) |

TABLE-continued

| DATA CONVERSION VALUE | | | | DATA-CONVERTED OUTPUT (DBS) | | | | | | | | | | | |
|---|---|---|---|---|---|---|---|---|---|---|---|---|---|---|---|
| | | | | BIT STREAM BS = 1 | | | | | | BIT STREAM BS = 0 | | | | | |
| T3 | T2 | T1 | T0 | B4 | B3 | B2 | B1 | B0 | | | B4 | B3 | B2 | B1 | B0 | |
| 0 | 0 | 1 | 0 | 0 | 0 | 1 | 0 | 0 | (+1.00) | | 1 | 1 | 0 | 1 | 1 | (−1.00) |
| 0 | 0 | 1 | 1 | 0 | 0 | 1 | 0 | 0 | (+1.00) | | 1 | 1 | 0 | 1 | 1 | (−1.00) |
| 0 | 1 | 0 | 0 | 0 | 0 | 1 | 0 | 0 | (+1.00) | | 1 | 1 | 0 | 1 | 1 | (−1.00) |
| 0 | 1 | 0 | 1 | 0 | 0 | 1 | 0 | 1 | (+1.25) | | 1 | 1 | 0 | 1 | 0 | (−1.25) |
| 0 | 1 | 1 | 0 | 0 | 0 | 1 | 1 | 0 | (+1.50) | | 1 | 1 | 0 | 0 | 1 | (−1.50) |
| 0 | 1 | 1 | 1 | 0 | 0 | 1 | 1 | 1 | (+1.75) | | 1 | 1 | 0 | 0 | 0 | (−1.75) |
| 1 | 0 | 0 | 0 | 0 | 1 | 0 | 0 | 0 | (+2.00) | | 1 | 0 | 1 | 1 | 1 | (−2.00) |
| 1 | 0 | 0 | 1 | 0 | 1 | 0 | 0 | 1 | (+2.25) | | 1 | 0 | 1 | 1 | 0 | (−2.25) |
| 1 | 0 | 1 | 0 | 0 | 1 | 0 | 1 | 0 | (+2.50) | | 1 | 0 | 1 | 0 | 1 | (−2.50) |
| 1 | 0 | 1 | 1 | 0 | 1 | 0 | 1 | 1 | (+2.75) | | 1 | 0 | 1 | 0 | 0 | (−2.75) |
| 1 | 1 | 0 | 0 | 0 | 1 | 1 | 0 | 0 | (+3.00) | | 1 | 0 | 0 | 1 | 1 | (−3.00) |
| 1 | 1 | 0 | 1 | 0 | 1 | 1 | 0 | 1 | (+3.25) | | 1 | 0 | 0 | 1 | 0 | (−3.25) |
| 1 | 1 | 1 | 0 | 0 | 1 | 1 | 1 | 0 | (+3.50) | | 1 | 0 | 0 | 0 | 1 | (−3.50) |
| 1 | 1 | 1 | 1 | 0 | 1 | 1 | 1 | 1 | (+3.75) | | 1 | 0 | 0 | 0 | 0 | (−3.75) |

Figure 6:
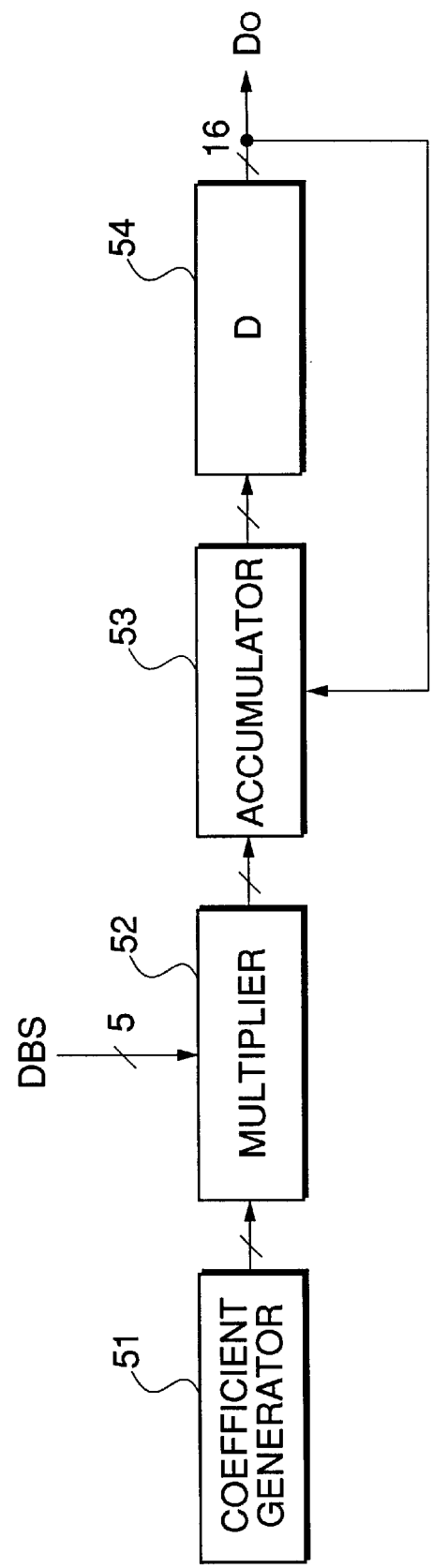
FIG. 6 is a block diagram showing the configuration of a decimation filter appearing in FIG. 3.

The 5-bit digital bit stream DBS outputted from the data converter 22 is input to the decimation filter 23. The decimation filter 23 is constructed, e.g. as shown in FIG. 6. A coefficient generator 51 stores impulse-response coefficients, which are selected and delivered to a multiplier 52 where the 5-bit digital bit stream DBS is multiplied by the impulse-response coefficients, and accumulated and held by an accumulator 53 and a latch circuit 54, to thus carry out a convolution process, whereby digital data Do which is 16 bits, for example, is outputted from the decimation filter 23.

Figure 7:
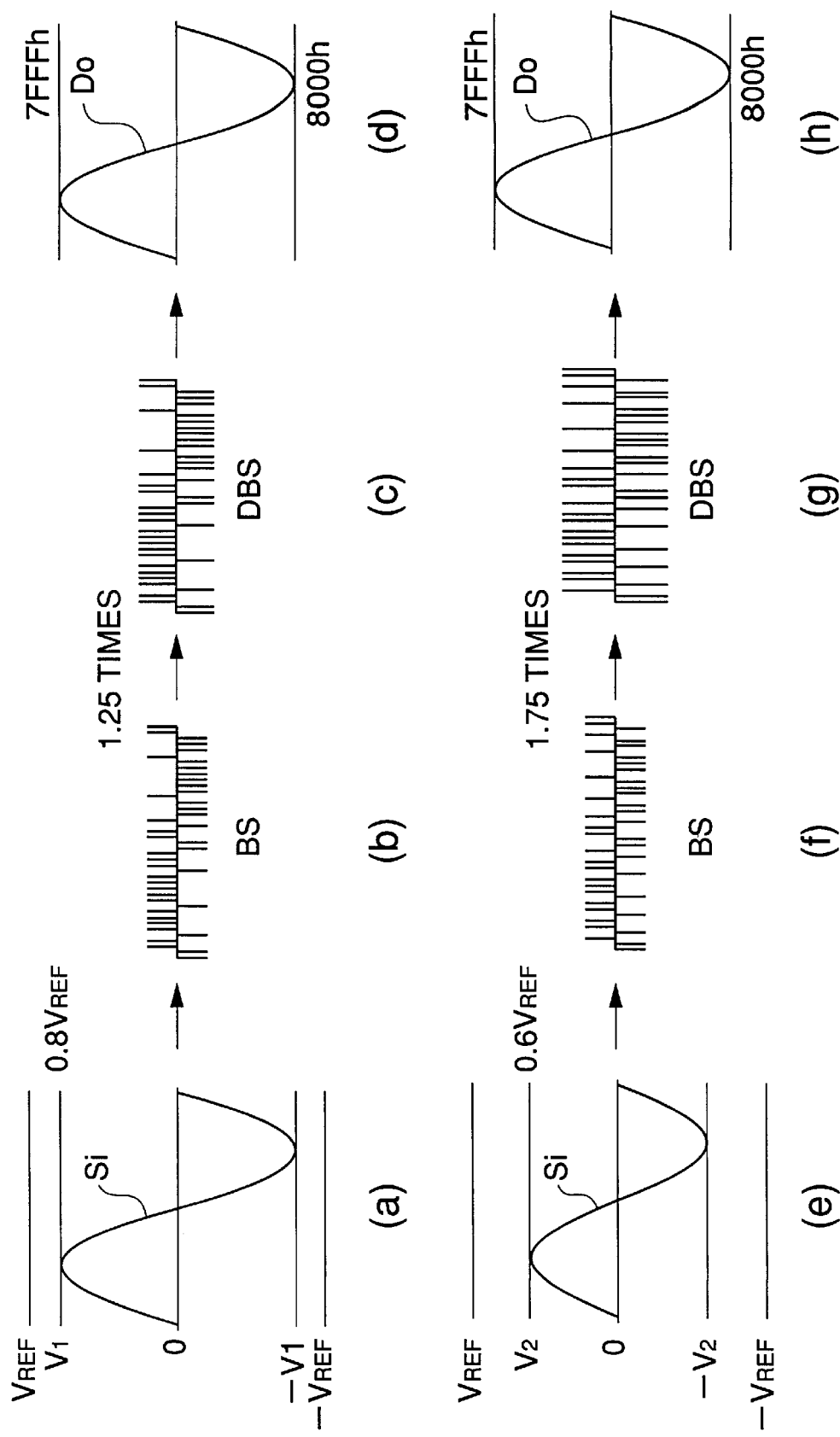
FIG. 7 is a diagram useful in explaining the operation of the delta-sigma A/D converter of FIG. 3.

FIG. 7 shows how the analog input signal Si input to the A/D converter constructed as above is processed and the digital data Do as the final output data is produced.

Referring first to (a) of FIG. 7, if the maximum level of the analog input signal Si is set to 0.8 times the feedback reference voltage ±VREF, a digital bit stream BS as shown in (b) of FIG. 7 is obtained by the ΔΣ modulator 21. In (b) of FIG. 7, bits having a value of 1 are shown by upward lines, and bits having a value of 0 by downward lines. If at this time a value "0101" is selected as the data conversion value T of the data converter 22, the bits B2 and B0 assume a value of 1 or 0 and the bit B2 is given a weight of 1 and the bit B0 a weight of 0.25, whereby the resulting data-converted value DBS becomes 1.25 times the value of the bit stream BS, as shown in (c) of FIG. 7 wherein the level is represented by the length of bit lines, and therefore the 16-bit digital data Do from the decimation filter 23 assumes a full-scale value ranging from "8000h" to "7FFFh" in hexadecimal notation, as shown in (d) of FIG. 7.

On the other hand, if the maximum level of the analog input signal Si is set to 0.6 times the feedback reference voltage ±VREF, a digital bit stream BS as shown in (f) of FIG. 7 is obtained by the ΔΣ modulator 21. If at this time a value "0111" is selected as the data conversion value T of the data converter 22, the resulting data-converted value DBS becomes 1.75 times the value of the bit stream BS, as shown in (g) of FIG. 7, and therefore, also in this case the 16-bit digital data Do from the decimation filter 23 assumes a full-scale value ranging from "8000h" to "7FFFh" in hexadecimal notation, as shown in (h) of FIG. 7.

In this way, according to the present embodiment, the data conversion value T of the data converter 22 is set to a suitable value according to the specified maximum level of the analog input signal Si. More specifically, if the data conversion value T is set to VREF/VM provided that the specified maximum level of the analog input signal Si is designated as VM, and the feedback reference voltage as VREF, it can be assured that full-scale data are always obtained as the digital data Do outputted from the decimation filter 23 at the maximum level of the analog input signal Si. Further, it is possible to adjust the data conversion value T such that full-scale data can be obtained at any desired level of the analog input signal Si. Besides, in the A/D converter according to the present embodiment, irrespective of the set or adjusted data conversion value T, the gain of the decimation filter 23 can always be set to 1 and hence no adjustment is required to change the impulse-response filters stored in the coefficient generator 51, which would be required whenever the gain is changed. This facilitates designing of the decimation filter as well as can prevent an increase in the number of coefficients of the decimation filter and provision of additional multipliers.

Figure 8:
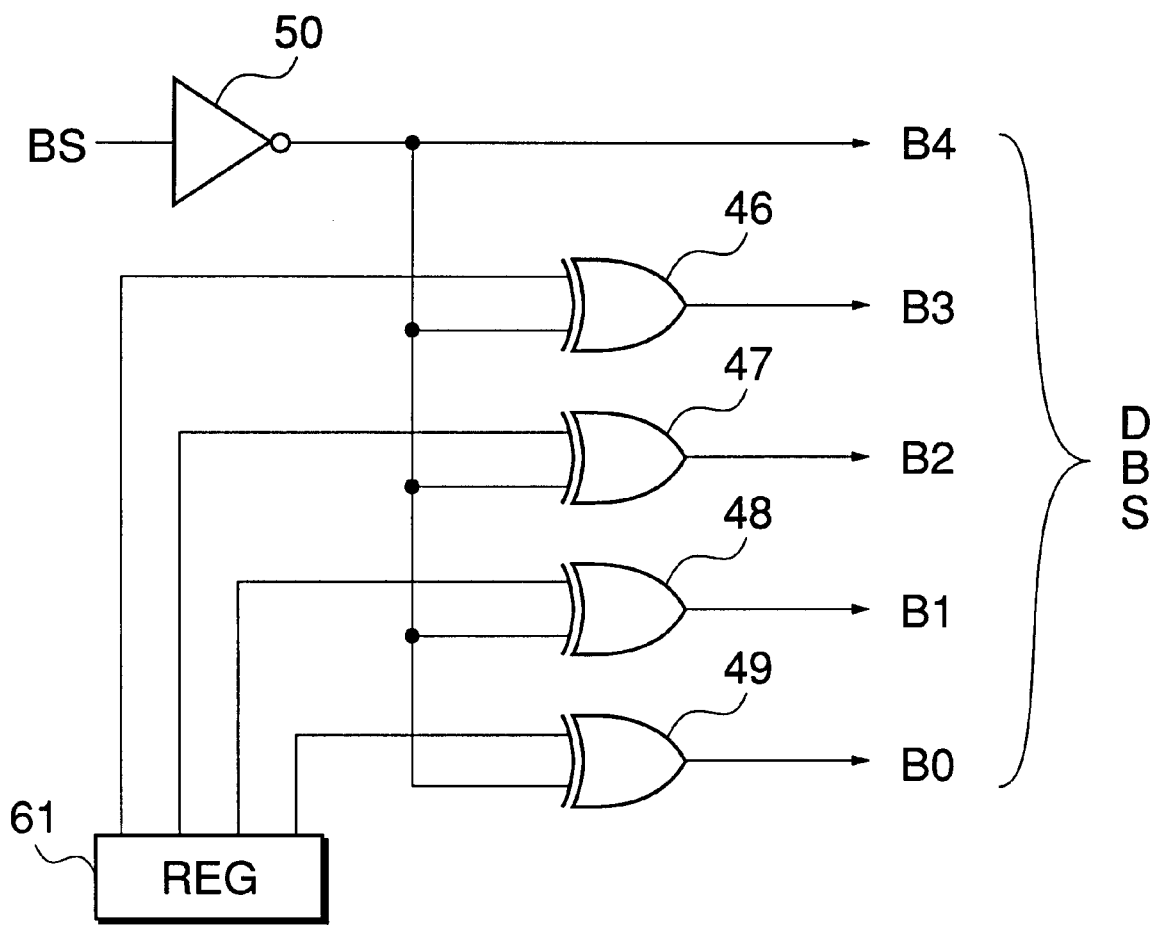
FIG. 8 is a circuit diagram showing the configuration of a data converter of a delta-sigma A/D converter according to another embodiment of the present invention.

Although in the above described embodiment 4-bit values are employed as the data conversion value T, the number of bits can be increased to enable finer adjustment. Advantageously, the A/D converter may be constructed such that the specified allowable level of the analog input signal at which full-scale digital data is obtained can be selected to values ½, ¼, ⅛, ... of the feedback reference voltage VREF, i.e. to a value $½^n$, the construction of the data converter has only to be slightly modified such that the lower nth bit of the data-converted output DBS is set to 1 (or 0) and the other bits to 0 (or 1). Therefore, the data converter may be constituted by EX-OR gates 46–49 and an inverter 50 alone, e.g. as shown in FIG. 8 and can thus be further simplified in construction.

Moreover, the present invention can also provide some effects even if the data conversion value is a fixed value. More specifically, by merely setting the values of coefficients stored in a register 61 in FIG. 8, the analog input signal level at which full-scale digital data are outputted can be set without any change in the gain of the decimation filter at a later stage, whereby the the ΔΣ modulator can be designed irrespective of the decimation filter.

Still further, both the feedback reference voltage ±VREF of the ΔΣ modulator and the data conversion value T may be made variable, which further facilitates adjustment of various sections so as to set the level of the analog input signal at which the maximum ratio S/N is obtained to the maximum level.

As described above, according to the invention, a digital bit stream before entering the decimation filter is converted into multi-bit data having a desired level by a data conversion device to thereby change the total gain of the data conversion device and the decimation filter as desired. As a result, for example, by changing the data conversion value of the data conversion device while the gain of the decimation filter is fixed, it is possible to easily change the analog input signal level at which the output digital data has a full-scale value.

Further, by setting the data conversion value of the data conversion device to a suitable value, full-scale digital data can be obtained at an analog input signal level equal to the specified maximum input signal level of the delta-sigma modulator. As a result, the delta-sigma modulator can be designed without taking into account the decimation filter at a later stage, thereby largely enhancing the degree of freedom of design of the delta-sigma modulator etc.

What is claimed is:

1. A delta-sigma A/D converter comprising:

a delta-sigma modulator for converting an analog signal input thereto into a 1-bit digital bit stream by a delta-sigma modulation wherein a difference between said analog signal and a feedback reference voltage is integrated and quantized, said feedback reference voltage being set to a value greater than a specified maximum level of said analog signal;

a data converter connected to an output of said delta-sigma modulator, for converting said 1-bit digital bit stream from said delta-sigma modulator into a multi-bit digital bit stream, using a predetermined conversion value; and a decimation filter connected to an output of said data converter, for extracting low frequency components corresponding to said analog signal, contained in said multi-bit digital bit stream from said data converter and for outputting multi-bit digital data representative of said analog signal.

2. A delta-sigma A/D converter as claimed in claim 1, wherein said predetermined conversion value can be set as desired.

3. A delta-sigma A/D converter as claimed in claim 2, wherein said predetermined conversion value is set to such a value that said multi-bit digital data from said decimation filter has a full-scale value when said analog signal has a desired level.

4. A delta-sigma A/D converter as claimed in claim 1, wherein said predetermined conversion value is set to such a value that said multi-bit digital data from said decimation filter has a full-scale value when said analog signal has said specified maximum level.

5. A delta-sigma A/D converter as claimed in claim 4, wherein said predetermined conversion value is set to a value equal to VREF/VM, where VREF represents said feedback reference voltage, and VM said specified maximum level of said analog signal.

6. A delta-sigma A/D converter as claimed in claim 1, wherein said predetermined conversion value is a fixed value.

7. A delta-sigma A/D converter as claimed in claim 6, wherein said predetermined conversion value is set to such a fixed value that said multi-bit digital data from said decimation filter has a full-scale value when said analog signal has a desired level.

8. A delta-sigma A/D converter as claimed in claim 4, wherein said data converter comprises an inverter for inverting said 1-bit digital bit stream from said delta-sigma modulator, a plurality of gate circuits connected to an output of said inverter, and a logic circuit which, when said predetermined conversion value assumes a value falling within a first predetermined range, applies a fixed value to said gate circuits irrespective of said predetermined conversion value and when said predetermined conversion value assumes a value falling within a second predetermined range, applies a predetermined value corresponding to said value falling within said second predetermined range to said gate circuits.

9. A delta-sigma A/D converter as claimed in claim 3, wherein said data converter comprises an inverter for inverting said 1-bit digital bit stream from said delta-sigma modulator, a plurality of gate circuits connected to an output of said inverter, and a register for storing coefficients for generating said predetermined conversion value.

10. A delta-sigma A/D converter as claimed in claim 7, wherein said data converter comprises an inverter for inverting said 1-bit digital bit stream from said delta-sigma modulator, a plurality of gate circuits connected to an output of said inverter, and a register for storing coefficients for generating said predetermined conversion value.

11. A method of gain scaling a delta-sigma A/D converter having a delta-sigma modulator for converting an analog signal input thereto into a 1-bit digital bit stream by a delta-sigma modulation wherein a difference between said analog signal and a feedback reference voltage is integrated and quantized, the method comprising the steps of;

setting said feedback reference voltage to a value a predetermined factor greater than a specified maximum level of said analog signal;

converting said 1-bit digital bit stream from said delta-sigma modulator into a multi-bit digital bit stream, using a predetermined conversion value corresponding to said predetermined factor; and extracting low frequency components corresponding to said analog signal, contained in said multi-bit digital bit stream and outputting multi-bit digital data representative of said analog signal.

* * * * *